US009671437B2

(12) United States Patent
Akahane (10) Patent No.: US 9,671,437 B2
(45) Date of Patent: Jun. 6, 2017

(54) OVERCURRENT DETECTION CIRCUIT (71) Applicant: FUJI ELECTRIC CO., LTD., Kawasaki-shi (JP)

(72) Inventor: Masashi Akahane, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 101 days.

(21) Appl. No.: 14/794,891

(22) Filed: Jul. 9, 2015

(65) Prior Publication Data
US 2015/0309090 A1 Oct. 29, 2015

Related U.S. Application Data (63) Continuation of application No. PCT/JP2014/063914, filed on May 27, 2014.

(30) Foreign Application Priority Data

Jun. 11, 2013 (JP) ................................. 2013-123180

(51) Int. Cl.
G01R 19/165 (2006.01)
H02M 1/08 (2006.01)
(Continued)

(52) U.S. Cl.
CPC ......... *G01R 19/16547* (2013.01); *H02H 3/08* (2013.01); *H02M 1/08* (2013.01);
(Continued)

(58) Field of Classification Search
CPC ..... G01R 19/16547; H02H 3/08; H03K 17/14
(Continued)

(56) References Cited

U.S. PATENT DOCUMENTS 5,193,393 A * 3/1993 Czarnocki ............... G01L 9/065
324/105
6,366,068 B1 * 4/2002 Morishita ............. H02M 3/156
323/282
(Continued)

FOREIGN PATENT DOCUMENTS

JP 2001-345686 A 12/2001
JP 2004-045305 A 2/2004
(Continued)

*Primary Examiner* — Christopher Mahoney
(74) *Attorney, Agent, or Firm* — Rabin & Berdo, P.C.

(57) ABSTRACT

An overcurrent detection circuit includes a current detection resistor that generates a voltage in proportion to current flowing through a switching element and a comparator that compares the voltage detected via the current detection resistor and a reference voltage generated by a reference voltage generation circuit to thereby detect overcurrent flowing through the switching element. In particular, the reference voltage generation circuit includes: a first resistance voltage dividing circuit that resistance-divides a standard voltage by connecting, in series, two types of resistors having different temperature characteristics; a second resistance voltage dividing circuit that resistance-divides the standard voltage by connecting, in series, resistors having the same temperature characteristics; and an instrumentation amplifier that generates the reference voltage according to the difference between the divided output voltages of the first and second resistance voltage dividing circuits.

14 Claims, 7 Drawing Sheets (51) Int. Cl.
*H02M 1/32* (2007.01)
*H03K 17/082* (2006.01)
*H03K 17/14* (2006.01)
*H02H 3/08* (2006.01)
*H02M 1/00* (2006.01)
*H02H 1/00* (2006.01)
*H02H 3/087* (2006.01)
*H02H 6/00* (2006.01)
*H02M 3/335* (2006.01)

(52) U.S. Cl.
CPC .......... *H02M 1/32* (2013.01); *H03K 17/0828* (2013.01); *H03K 17/14* (2013.01); *H02H 1/0007* (2013.01); *H02H 3/087* (2013.01); *H02H 6/00* (2013.01); *H02M 3/33507* (2013.01); *H02M 2001/0009* (2013.01); *H03K 2217/0027* (2013.01)

(58) Field of Classification Search
USPC ........................................................ 324/537
See application file for complete search history.

(56) References Cited

U.S. PATENT DOCUMENTS

| 2006/0176043 | A1 | 8/2006 | Makino et al. |
| 2008/0100978 | A1* | 5/2008 | Maebara et al. ... H03K 17/0828 361/93.8 |
| 2016/0211657 | A1* | 7/2016 | Hayashi ................ H03K 17/14 |

FOREIGN PATENT DOCUMENTS

| JP | 2005-342443 A | 12/2005 |
| JP | 2006-221241 A | 8/2006 |

* cited by examiner

OVERCURRENT DETECTION CIRCUIT

CROSS-REFERENCE TO RELATED APPLICATIONS

This application is a bypass continuation application of International Application number PCT/JP2014/063914, filed on May 27, 2014 and designating the United States. Furthermore, this application claims the benefit of priority of Japanese Patent Application No. 2013-123180, filed on Jun. 11, 2013. The disclosures of both of these earlier applications are incorporated herein by reference.

TECHNICAL FIELD

The present invention relates to an overcurrent detection circuit having a simple configuration that can accurately detect overcurrent flowing through a switching element of a power convertor.

BACKGROUND ART

In a power supply device for driving an AC load, such as a motor or a power convertor, a half bridge circuit created by directly connecting first and second switching elements can be employed. This power convertor switches the input DC power via the first and second switching elements, and supplies AC power to the load, which is connected to a mid-point of the half bridge circuit. The first and second switching elements are, for example, IGBTS or MOS-FETS having high withstand voltages. The first and second switching elements are alternately turned ON/OFF by a drive control circuit which is implemented as a power IC, for example.

In this drive control circuit, an overcurrent detection circuit is normally employed to stop the first and second switching elements from turning ON when an overcurrent flowing through the switching elements is detected. This overcurrent detection circuit protects the load, connected to the power convertor, and also the switching elements when an overcurrent is detected. The overcurrent detection circuit is configured by a current detection resistor, which generates a voltage in proportion to the current flowing through the switching elements, and a comparator, which compares the voltage detected via the current detection resistor and a predetermined reference voltage to detect an overcurrent flowing through the switching elements. For example, if the switching elements are IGBTs, the current detection element is constituted by a current sensing IGBT.

Figure 7:
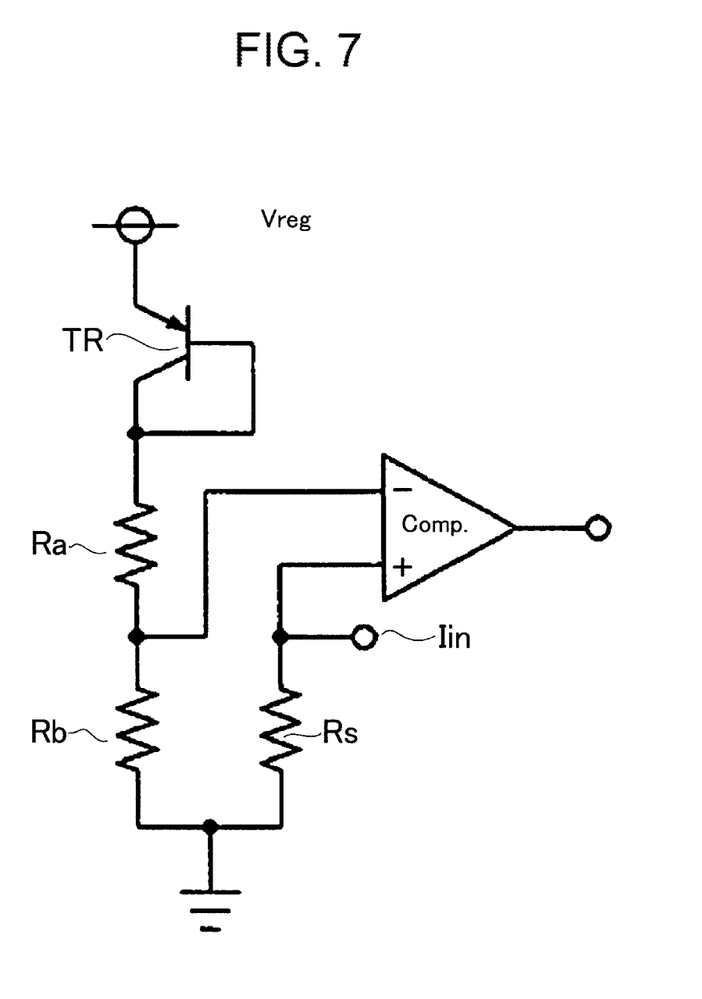
FIG. 7 is a diagram depicting an example of a conventional overcurrent detection circuit.

In this case, it is necessary to construct the overcurrent detection circuit considering the output temperature characteristic of the current detection circuit, in order to improve overcurrent detection accuracy and prevent malfunction. Therefore it has been advocated that a standard voltage Vreg be applied to a resistance dividing circuit, which is constituted by resistors Ra and Rb connected in series, as shown in FIG. 7, and which generates a reference voltage by resistance-dividing the standard voltage Vreg via a bipolar transistor TR (e.g. see Patent Document 1, which is identified below). This overcurrent detection circuit is for providing a temperature characteristic, which corresponds to the output temperature characteristic of the current detection element, to the reference voltage.

In other words, the overcurrent detection circuit having the configuration shown in FIG. 7 provides a positive temperature characteristic to the reference voltage using the negative characteristic of the diode-connected bipolar transistor TR, whereby the positive output temperature characteristic of the current detection element is cancelled out. In FIG. 7, Rs denotes a current detection resistor which converts the current supplied from the current input terminal Tin into voltage. Comp denotes a comparator that compares the reference voltage generated by the resistance dividing circuit and the voltage in proportion to the current flowing through the switching element, which is detected via the current detection resistor Rs.

Patent Document 1: Japanese patent Application Laid-open No. 2004-45305

DISCLOSURE OF THE INVENTION

However, the following problems occur in the case where the overcurrent detection circuit, having the configuration shown in FIG. 7, is integrated into the driver circuit on the high side in the drive control circuit, which turns the first and second switching elements respectively ON.

In other words, the driver circuit on the high side is configured to perform a floating operation using the mid-point voltage in the half bridge circuit as the standard potential. Therefore as the switching element on the high side turns ON or OFF, displacement current flows into a high side region (this is a region of the circuit element substrate where the driver circuit is on the high side; the drive control circuit constituted by a power supply IC is formed on this circuit element substrate.) Then due to this displacement current, the potential in the high side region on the circuit element substrate fluctuates. As a result, not only the standard potential of the driver circuit on the high side, which performs a floating operation as mentioned above, but also the power supply voltage fluctuates.

Further, forward current is easily generated, because of the displacement current, due to the negative voltage surge caused by the ON/OFF operation of the switching element on the high side, and forward bias is applied to the parasitic diode structure at the junction of the circuit element substrate of the well. Then the bipolar transistor TR malfunctions due to the voltage fluctuation and the displacement current, which causes a fluctuation in the reference voltage. This means that it is difficult to detect overcurrent flowing through the switching element on the high side accurately and stably.

With the foregoing in view, it is an object of the present invention to provide an overcurrent detection circuit having a simple configuration, which allows to accurately detect overcurrent flowing through the switching element constituting a power convertor, without using a bipolar transistor which may malfunction.

In order to achieve the above object, an overcurrent detection circuit according to the present invention is disposed in a driver circuit that turns a switching element of a half bridge circuit ON/OFF, and controls operation of the driver circuit by detecting current flowing through the switching element, the overcurrent detection circuit having: a current detection resistor that generates voltage in proportion to current flowing through the switching element, based on the output of a current detection element incorporated into the switching element; a reference voltage generation circuit that generates reference voltage having a temperature characteristic that is corresponded to the output temperature characteristic of the current detection element, by resistance-dividing a predetermined standard voltage; and a comparator that detects overcurrent of the current flowing through the switching element by comparing the reference voltage generated by the reference voltage generation circuit and the voltage detected via the current detection resistor.

It is preferable that the reference voltage generation circuit includes: a first resistance voltage dividing circuit that resistance-divides the standard voltage by connecting, in series, two types of resistors having different temperature characteristics; a second resistance voltage dividing circuit that resistance-divides the standard voltage by connecting, in series, resistors having the same temperature characteristics; and an instrumentation amplifier that generates the reference voltage according to the differential voltage of each divided output voltage of the first and second resistance voltage dividing circuits (that is, the difference between the divided output voltages produced by the first and second resistance voltage dividing circuits).

One of the two types of resistors having different temperature characteristics is constituted by a low temperature coefficient resistor, the resistance temperature coefficient of which can be regarded as zero, such as a high resistance poly-silicon resistor, which is simultaneously integrated on a circuit element substrate constituted by a semiconductor where the overcurrent detection circuit is constructed.

The instrumentation amplifier includes a resistor for gain adjustment and a resistor for offset adjustment, and can variably set the temperature characteristic of the reference voltage by adjusting these resistors.

The switching element is an IGBT, for example, and the current detection element is implemented as a current sensing IGBT, which is integrated with the IGBT and is mirror-connected to the IGBT.

In the overcurrent detection circuit having the above mentioned configuration, the reference voltage generation circuit itself generates reference voltage having a predetermined temperature characteristic, that is, a temperature characteristic corresponding to the output temperature characteristic of the current detection element. Therefore according to the overcurrent detection circuit having this configuration, overcurrent flowing through the switching element can be detected simply, accurately and stably. As a result, the switching element can be protected from overcurrent flowing through the switching element with certainty.

Particularly in the overcurrent detection circuit according to the present invention, the reference voltage is generated, via the instrumentation amplifier, from the differential voltage between the divided voltage of the standard voltage by the first resistance voltage dividing circuit using two types of resistors having different temperature characteristics, and the divided voltage of the standard voltage by the second resistance voltage dividing circuit using resistors having same temperature characteristics. Therefore the reference voltage can be stably generated without causing problems if a conventional bipolar transistor is used for generation. As a result, overcurrent flowing through the switching element can be detected stably and highly accurately, with a simple configuration, which has significant effects in practical terms.

BEST MODE FOR CARRYING OUT THE INVENTION

An overcurrent detection circuit according to an embodiment of the present invention will be described with reference to the drawings.

Figure 1:
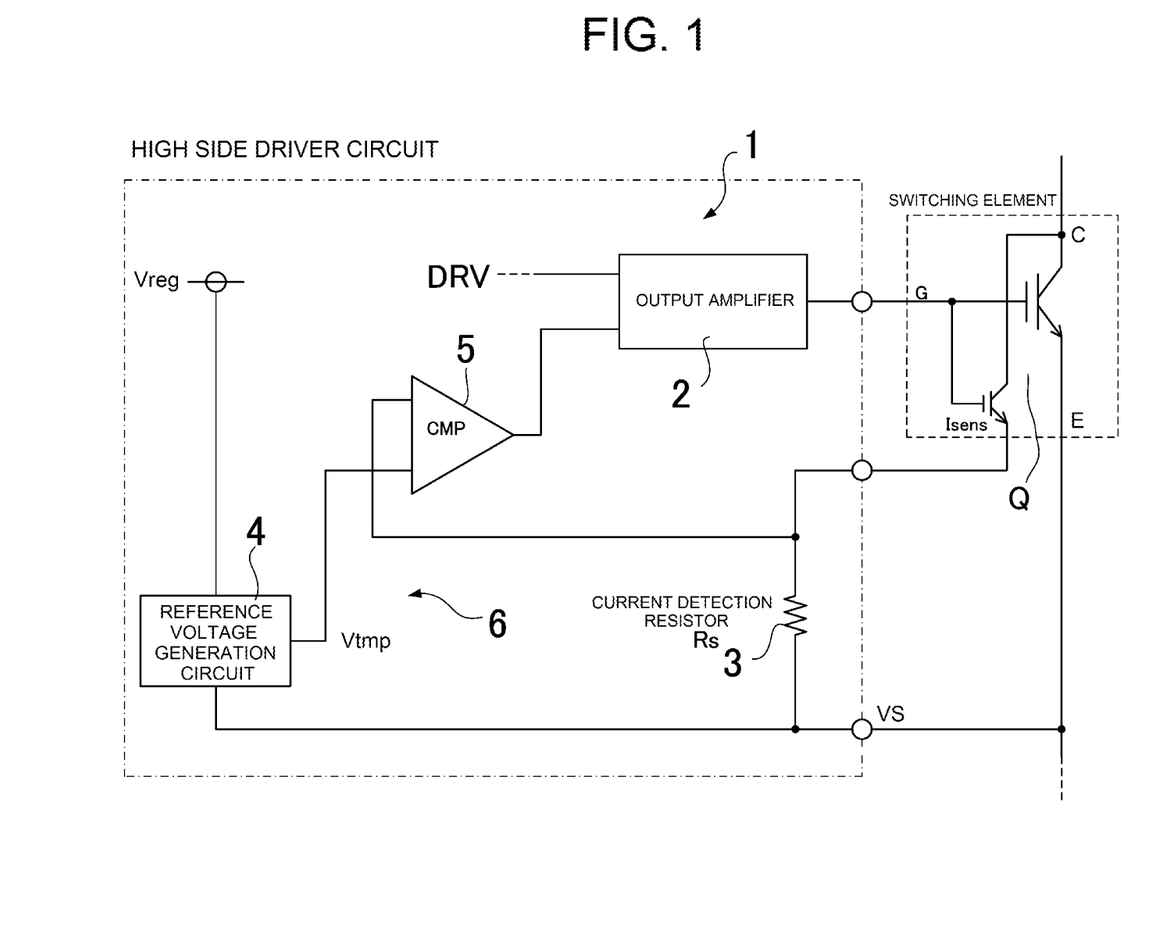
FIG. 1 is a diagram depicting a general configuration of an overcurrent detection circuit according to Embodiment 1 of the present invention, and a general configuration of a driver circuit including this overcurrent detection circuit.

FIG. 1 shows the general configuration of a key section of a driver circuit that turns the switching element Q on a high side ON/OFF, constituting a half bridge circuit of a power convertor. The switching element Q is constituted by an IGBT having a high withstand voltage, and a current sensing IGBT is integrated with this IGBT by mirror-connection. The current sensing IGBT outputs a micro-current in proportion to the current flowing through the IGBT.

The driver circuit 1 that turns the switching element Q ON/OFF is mainly constituted by an output amplifier 2, to which a drive control signal DRV is inputted and which applies a predetermined drive pulse signal to a gate of the switching element Q. The driver circuit 1 also includes a current detection resistor 3 that generates voltage in proportion to current flowing through the switching element Q from current outputted from the current sensing IGBT. The driver circuit 1 also includes a comparator 5 that compares the voltage determined via the current detection resistor 3 and a predetermined reference voltage Vtmp generated by a reference voltage generation circuit 4, so as to detect overcurrent flowing through the switching element Q.

The current detection resistor 3, the reference voltage generation circuit 4, and the comparator 5 constitute an overcurrent detection circuit 6 for the switching element Q. When overcurrent is detected by the overcurrent detection circuit 6, the output of the overcurrent detection circuit 6, specifically the operation of the output amplifier 2 based on the output of the comparator 5, is disabled. By stopping the operation of the output amplifier 2, the ON/OFF driving of the switching element Q is stopped, and the switching element Q is protected from overcurrent.

Figure 2:
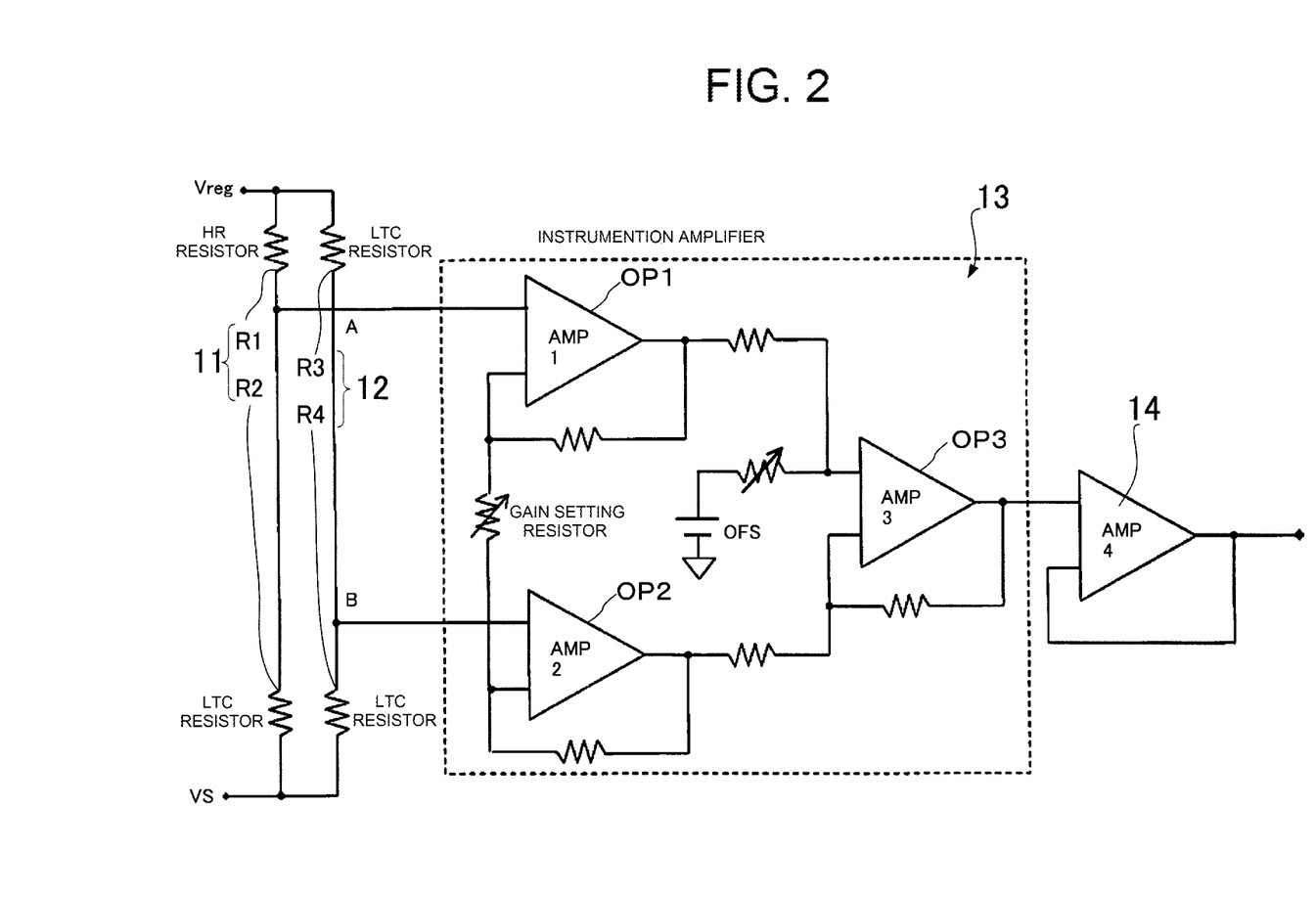
FIG. 2 is a diagram depicting a general configuration of a reference voltage generation circuit in the overcurrent detection circuit shown in FIG. 1.

The overcurrent detection circuit 6 according to the present invention is characterized in that the reference voltage generation circuit 4 generates the reference voltage Vtmp that is provided to the comparator 5 for setting an overcurrent detection threshold. The reference voltage generation circuit 4 performs resistance-dividing a predetermined standard voltage Vreg so as to generate the reference voltage Vtmp having a temperature characteristic in accordance with the output temperature characteristic of the switching element Q, and is configured as shown in FIG. 2, for example.

The reference voltage generation circuit 4 includes a first resistance voltage dividing circuit 11 that resistance-divides the standard voltage Vreg by connecting, in series, two types of resistors R1 and R2 having different temperature characteristics, and a second resistance voltage dividing circuit 12 that resistance-divides the standard voltage Vreg by connecting, in series, resistors R3 and R4 having same temperature characteristics. Further, the reference voltage generation circuit 4 includes an instrumentation amplifier 13 that generates the reference voltage Vtmp according to differential voltage of each divided output voltage of the first and second resistance voltage dividing circuits 11 and 12, and a buffer amplifier 14 that provides the output of the instrumentation amplifier 13 to the comparator 5.

Of the resistors R1, R2, R3 and R4 constituting the first and second resistance voltage dividing circuits 11 and 12, the resistor R1, for example, is a general HR (High Resistance) element having a resistance temperature coefficient to decrease the resistance value as the temperature increases in the same manner as the switching element Q, that is, the so called "HR resistor". The resistors R2, R3 and R4, on the other hand, are resistors each constituted by LTC (Low Temperature Coefficient) reference element, of which resistance value hardly changes with respect to the temperature change, in other words, of which resistance temperature coefficient can be regarded as zero, and such a low temperature coefficient reference element is called an "LTC Resistor".

The HR resistor and the LTC resistor are both poly-silicon resistors which is a common semiconductor component, but have different temperature characteristics generated by making the dosage, that is, the injection amount of electrons and ions, different in the respective semiconductor fabrication steps. Concrete steps of fabricating the HR resistor and the LTC resistor are disclosed in detail in Japanese Patent No. 4547753 or Japanese Patent Application Laid-open No. 2008-227061.

The instrumentation amplifier 13 is configured by a pair of operational amplifiers OP1 and OP2, which constitute an input stage, and an operational amplifier OP3, which amplifies the voltage difference of each output of the operational amplifiers OP1 and OP2. This instrumentation amplifier 13 has a characteristic in that the input impedance is high and the two inputs are highly symmetric. Further, the instrumentation amplifier 13 can not only set the amplification factor to high, but can also variably set the amplification factor by merly adjusting the resistor for gain adjustment, and the offset voltage can also be easily adjusted.

Figure 3:
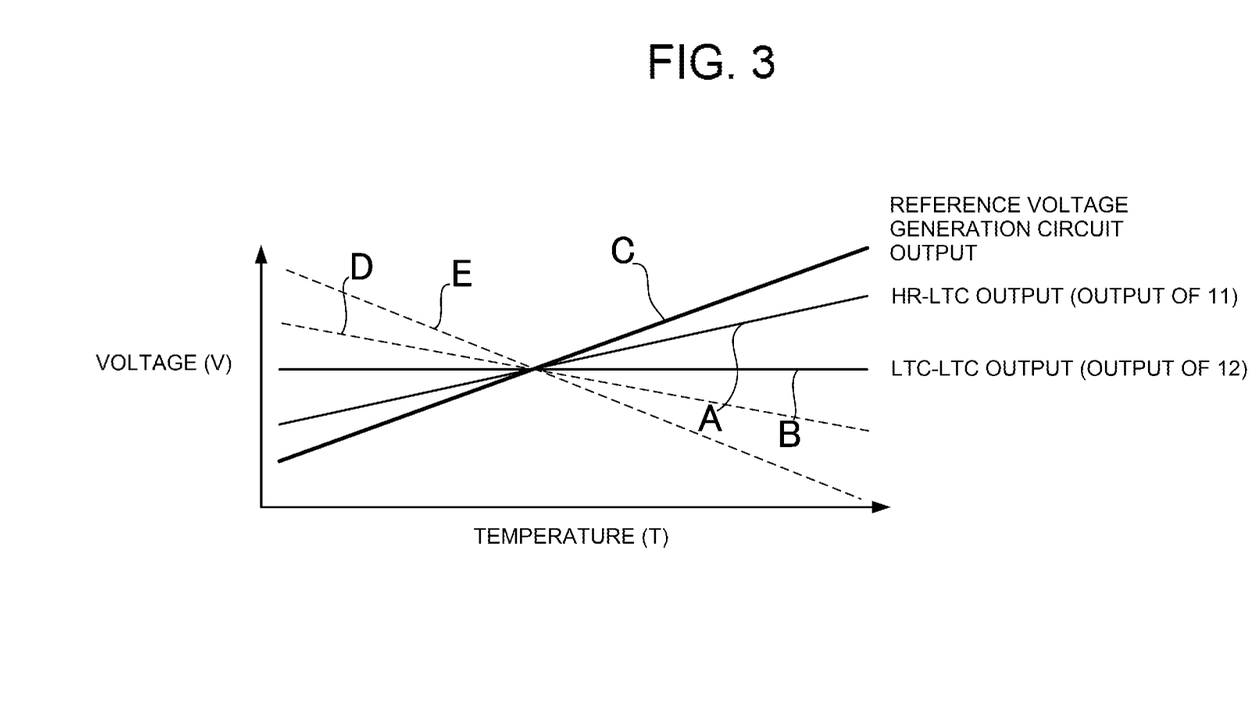
FIG. 3 is a diagram depicting a temperature characteristic of the reference voltage generated by the reference voltage generation circuit shown in FIG. 2.

Therefore according to the reference voltage generation circuit 4 that is configured by the first and second resistance voltage dividing circuits 11 and 12 and the instrumentation amplifier 13, the reference voltage Vtmp having a temperature characteristic in accordance with the output temperature characteristic of the switching element Q can be easily generated. In other words, FIG. 3 shows the change of each output voltage of the first and second resistance voltage dividing circuits 11 and 12 and the instrumentation amplifier 13 with respect to a temperature change, and the output voltage of the first resistance voltage dividing circuit 11 reflects the temperature characteristic of the HR resistor R1 (see characteristic A). The change in the output voltage of the second resistance voltage dividing circuit 12 can be virtually zero (see characteristic B). In the instrumentation amplifier 13, the difference of each output voltage of the first and second resistance voltage dividing circuits 11 and 12 is amplified at a predetermined amplification factor and is outputted (see characteristic C).

Therefore the temperature characteristic of the reference voltage Vtmp generated by the reference voltage generation circuit 4 can be simply and accurately matched with the output temperature characteristic of the switching element Q merely by adjusting the amplification factor of the instrumentation amplifier 13. As a result, the overcurrent detection circuit 6 can be set such that overcurrent can always be detected with a predetermined threshold voltage, regardless the change of the temperature, for example.

In a power convertor constituted by a DC-DC convertor, for example, the reference voltage Vtmp corresponding to the detection threshold of the overcurrent for the switching element Q is often set to 3.15 V (±10%) at a 25° C. temperature, for example, and to 4.25V (±10%) at a 125° C., for example, taking the operation characteristic of the switching element Q into account. For such a specification for overcurrent detection as well, the detection threshold in accordance with temperature, that is the reference voltage Vtmp, can easily be set merely by adjusting the amplification factor of the instrumentation amplifier 13 if the overcurrent detection circuit 6 configured as above is used.

Figure 4:
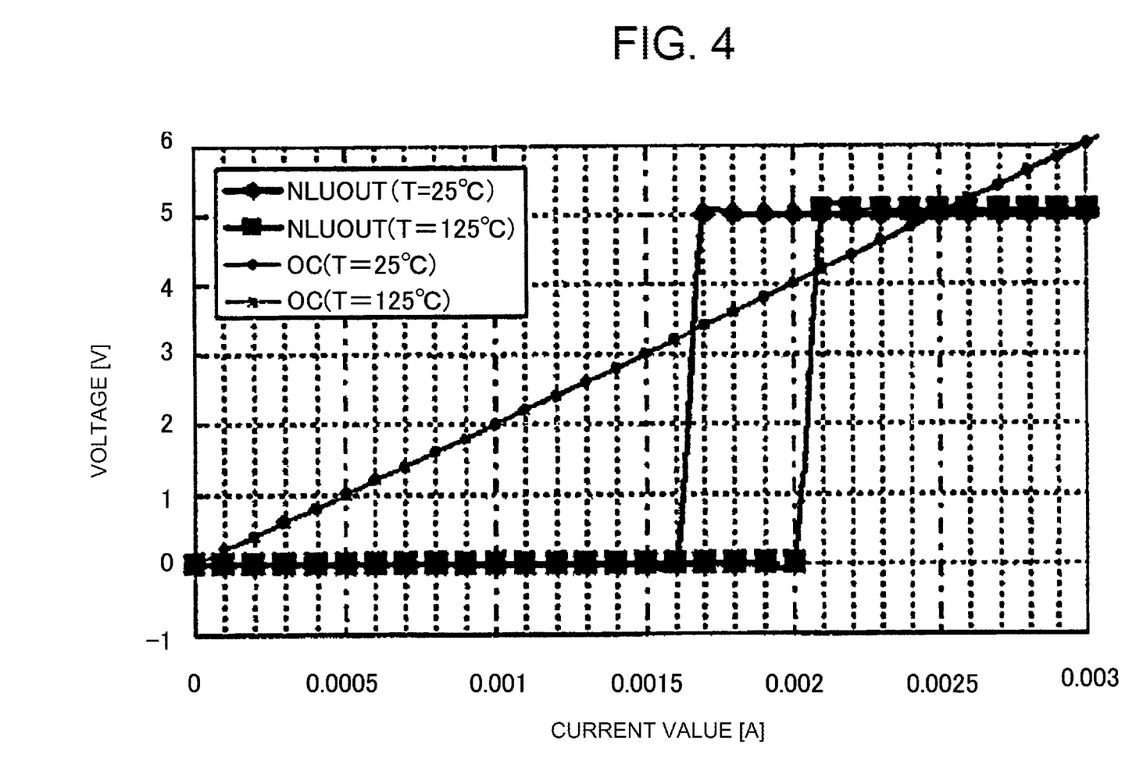
FIG. 4 is a diagram depicting an output characteristic of the overcurrent detection circuit shown in FIG. 1.

FIG. 4 shows a result of an experiment conducted by the present inventor. As the characteristics in FIG. 4 show, it was confirmed that if the overcurrent detection circuit 6 having the above mentioned configuration is used, overcurrent was detected highly accurately and stably with a 3.2V reference voltage Vtmp at a 25° C. temperature, and with a 4.25V reference voltage Vtmp at a 125° C. temperature respectively.

Thus according to the overcurrent detection circuit 6 that operates based on the reference voltage Vtmp (the detection threshold of the overcurrent detection), which was generated by the reference voltage generation circuit 4 configured by the first and second resistance voltage dividing circuits 11 and 12 using the HR resistor and the LTC resistor, and the instrumentation amplifier 13, overcurrent can be detected highly accurately and stably without being influenced by a possible malfunction of a bipolar transistor TR, as in the case of the prior art. Furthermore, the instrumentation amplifier 13 itself can be integrated into the driver circuit 1. Therefore an overly complicate configuration of the overcurrent detection circuit 6 can be avoided. Hence the present invention has significant practical advantages to implement the driver circuit 1 that includes a high performance overcurrent protection function.

Figure 5:
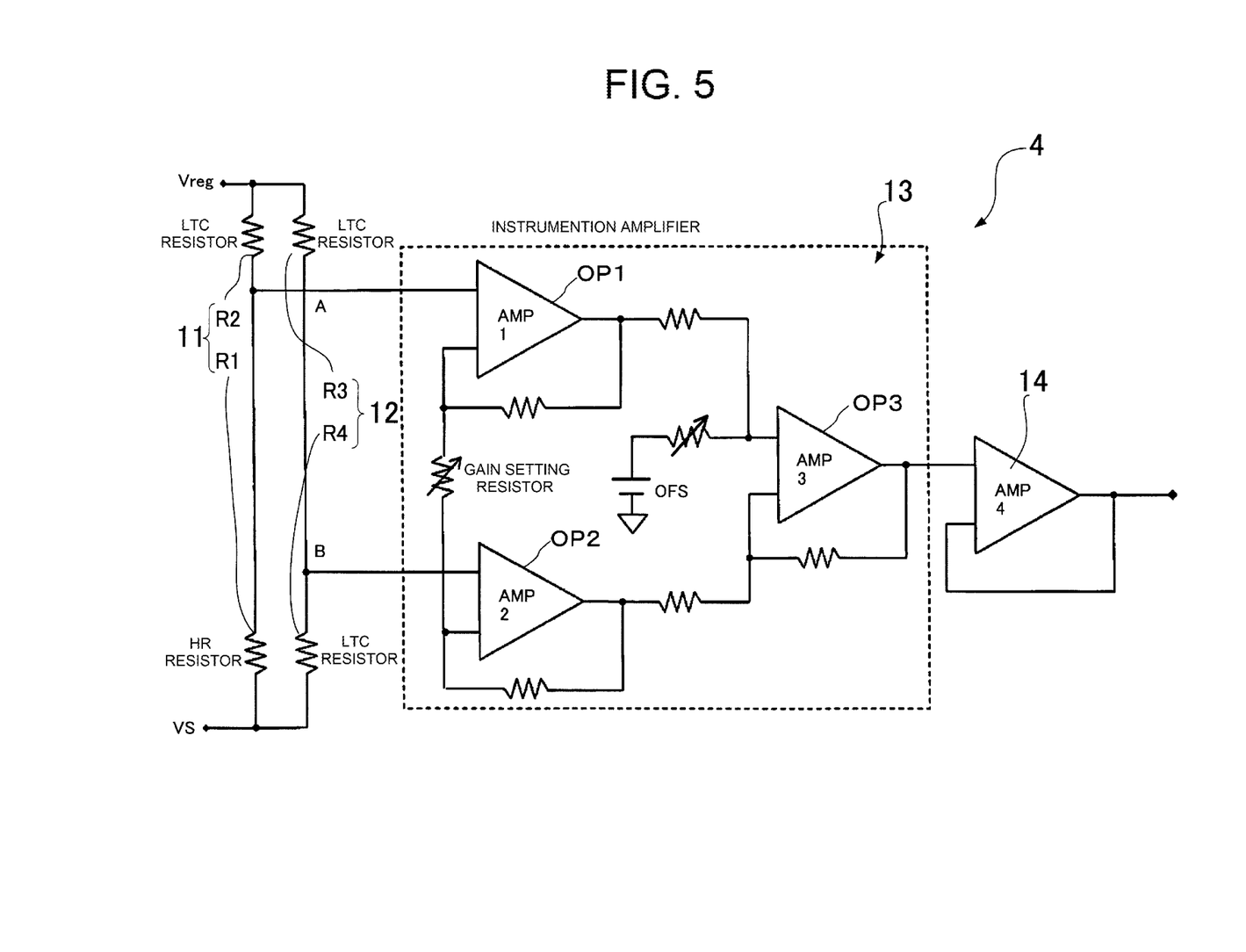
FIG. 5 is a diagram depicting a general configuration of a reference voltage generation circuit in an overcurrent detection circuit according to Embodiment 2 of the present invention.

The present invention is not limited to the above embodiment. For example, as shown in FIG. 5, the HR resistor R1 and the LTC resistor R2 in the first resistance voltage dividing circuit 11 may be virtually reversed. If the reference voltage generation circuit 4 is configured like this, the output voltage of the first resistance voltage dividing circuit 11 can have a negative temperature characteristic (see Characteristic D in FIG. 3). As a result, the reference voltage Vtmp, which is the output voltage of the reference voltage generation circuit 4, can have a negative temperature characteristic (see Characteristic E). Therefore the temperature characteristic of the reference voltage Vtmp can be set to a wide range in accordance with the output temperature characteristic of the switching element Q, so as to support various applications.

Figure 6:
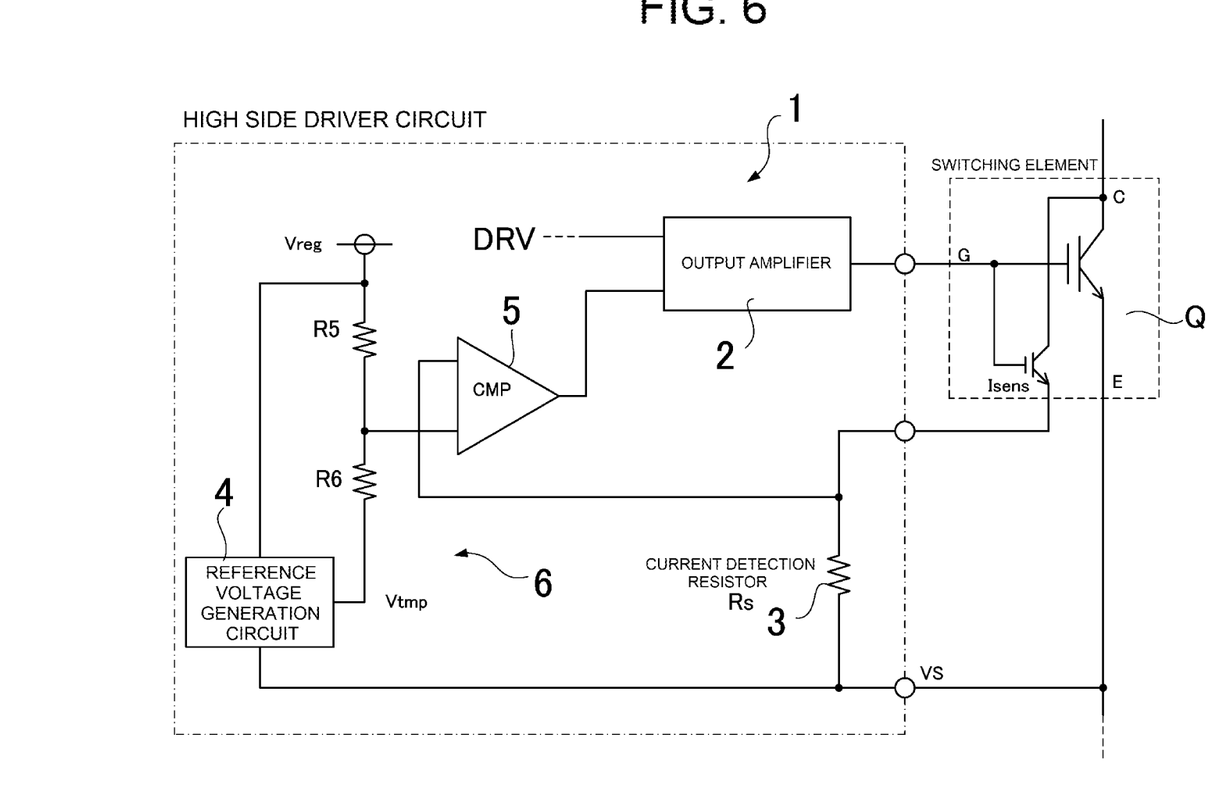
FIG. 6 is a diagram depicting a general configuration of an overcurrent detection circuit according to Embodiment 3 of the present invention, and a general configuration of a driver circuit including this overcurrent detection circuit.

As shown in FIG. 6, the reference voltage Vtmp, which is the output voltage of the reference voltage generation circuit 4, may be resistance-divided via a third resistance voltage dividing circuit constituted by resistors R5 and R6 connected in series, and provided to the comparator 5. If this configuration is used, the detection threshold to be provided to the comparator 5 can be set higher than the standard potential VS in a state of maintaining the output voltage temperature characteristic of the reference voltage generation circuit 4. Hence the stable operation of the comparator 5 can easily be guaranteed.

Here the driver circuit 1 on the high side was described as an example, but the overcurrent detection circuit 6 may of course be constructed for the driver circuit on the low side as well by integrating a reference voltage generation circuit 4 having a similar configuration. The present invention can be modified in various ways within a scope not departing from the true spirit thereof.

EXPLANATION OF REFERENCE NUMERALS 1 driver circuit
2 output amplifier
3 current detection resistor
4 reference voltage generation circuit
5 comparator
6 overcurrent detection circuit
11 first resistance voltage dividing circuit
12 second resistance voltage dividing circuit
13 instrumentation amplifier
14 buffer amplifier
Q switching element (IGBT)

The invention claimed is:

1. An overcurrent detection circuit for use in a driver circuit that turns a switching element ON/OFF to switch input power and that controls operation of the driver circuit by detecting current flowing through the switching element, the switching element having a current detection element incorporated therein, said overcurrent detection circuit comprising:
a current detection resistor that generates voltage in proportion to the current flowing through the switching element, based on the output of the current detection element incorporated into the switching element;
a reference voltage generation circuit that generates a reference voltage having a temperature characteristic that is in proportion to an output temperature characteristic of the current detection element, by resistance-dividing a predetermined standard voltage; and
a comparator that detects overcurrent of the current flowing through the switching element by comparing the reference voltage generated by the reference voltage generation circuit and the voltage detected via the current detection resistor,
wherein the reference voltage generation circuit includes a first resistance voltage dividing circuit comprising a first resistor and a second resistor connected in series between the standard voltage and an output voltage output from the switching element,
wherein the first resistor has a resistance temperature coefficient such that a resistance of the first resistor rises and falls proportionally to a rise and fall of a temperature of the first resistor, and
wherein the second resistor has a resistance temperature coefficient such that a resistance of the second resistor is independent of a temperature of the second resistor.

2. The overcurrent detection circuit according to claim 1, wherein the reference voltage generation circuit further includes:
a second resistance voltage dividing circuit that resistance-divides the standard voltage by connecting, in series, third resistors having the same temperature characteristics such that a resistance of the third resistors rises and falls proportionally to a rise and fall of a temperature of the third resistors; and
an instrumentation amplifier that generates the reference voltage according to the difference between the divided output voltages of the first and second resistance voltage dividing circuits.

3. The overcurrent detection circuit according to claim 2, wherein the instrumentation amplifier includes a resistor for gain adjustment and a resistor for offset adjustment, the reference voltage having a temperature characteristic that varies according to resistance values of the resistor for gain adjustment and the resistor for offset adjustment.

4. The overcurrent detection circuit according to claim 2, wherein the instrumentation amplifier further comprises:
a first operational amplifier (op-amp) configured to receive as first input a first voltage output from the first resistance voltage dividing circuit;
a second op-amp configured to receive as a first input a second voltage output from the second resistance voltage dividing circuit; and
a third op-amp configured to receive as inputs a first amplified voltage output from the first op-amp and second amplified voltage output from the second op-amp, and
wherein the reference voltage generator further comprises a fourth op-amp configured to output the reference voltage, and configured to receive as inputs the reference voltage and an output from the third op-amp.

5. The overcurrent detection circuit according to claim 4, wherein the instrumentation amplifier further comprises:
a gain-setting resistor connected between a second input of the first op-amp and a second input of the second op-amp, the gain-setting resistor being a variable resistor having an adjustable resistance value.

6. The overcurrent detection circuit according to claim 5, wherein the instrumentation amplifier further comprises:
an offset-adjustment resistor having one end connected to an output of the first op-amp and an opposite end connected to ground, the offset-adjustment resistor being a variable resistor having an adjustable resistance value.

7. The overcurrent detection circuit according to claim 1, wherein the second resistor is a low temperature coefficient resistor, and the resistance temperature coefficient of the second resistor is zero.

8. The overcurrent detection circuit according to claim 1, wherein the switching element is an insulated-gate bipolar transistor (IGBT), and the current detection element is a current sensing IGBT that is integrated with the IGBT and is mirror-connected to the IGBT.

9. An overcurrent detection circuit for use in a driver circuit that turns a switching element on/off to switch input power and that controls operation of the driver circuit by detecting current flowing through the switching element, said overcurrent detection circuit comprising:
current detection means for generating a detected voltage that is proportional to the current flowing through the switching element;
reference voltage generation means for generating a reference voltage having a temperature characteristic that is proportional to a temperature characteristic of the switching element; and
overcurrent detection means for detecting overcurrent of the current flowing through the switching element by comparing the detected voltage and the reference voltage,
wherein the reference voltage generation means includes a first resistance voltage dividing circuit comprising a first resistor and a second resistor connected in series between the standard voltage and an output voltage output from the switching element, wherein the first resistor has a resistance temperature coefficient such that a resistance of the first resistor rises and falls proportionally to a rise and fall of a temperature of the first resistor, and wherein the second resistor has a resistance temperature coefficient such that a resistance of the second resistor is independent of a temperature of the second resistor.

10. The overcurrent detection circuit according to claim 9, wherein the reference voltage generation means further comprises:

a second resistance voltage dividing circuit that resistance-divides the predetermined voltage to provide a second divided voltage, the second resistance dividing circuit including third resistors having the same temperature characteristics, such that a resistance of the third resistors rises and falls proportionally to a rise and fall of a temperature of the third resistors; and means for generating the reference voltage according to the difference between the first and second divided voltages.

11. The overcurrent detection circuit according to claim 10, wherein the means for generating the reference voltage comprises an instrumentation amplifier.

12. The overcurrent detection circuit according to claim 11, wherein the instrumentation amplifier includes a resistor for gain adjustment and a resistor for offset adjustment, the reference voltage having a temperature characteristic that is set by adjusting these resistors.

13. The overcurrent detection circuit according to claim 10, wherein the second resistor is a low temperature coefficient resistor.

14. The overcurrent detection circuit according to claim 9, wherein the switching element is an IGBT.

* * * * *